(12) United States Patent
Sasaki et al.

(10) Patent No.: US 8,278,126 B2
(45) Date of Patent: Oct. 2, 2012

(54) METHOD FOR MANUFACTURING ORGANIC ELECTROLUMINESCENCE DEVICE

(75) Inventors: Makoto Sasaki, Tsukuba (JP); Shinichi Morishima, Tsukuba (JP); Norihito Ito, Misato (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 88 days.

(21) Appl. No.: 12/670,524

(22) PCT Filed: Jul. 24, 2008

(86) PCT No.: PCT/JP2008/063284
§ 371 (c)(1), (2), (4) Date: Jan. 25, 2010

(87) PCT Pub. No.: WO2009/017024
PCT Pub. Date: Feb. 5, 2009

(65) Prior Publication Data
US 2010/0227422 A1   Sep. 9, 2010

(30) Foreign Application Priority Data
Jul. 31, 2007  (JP) .................................. 2007-200099

(51) Int. Cl.
*H01L 21/00* (2006.01)
(52) U.S. Cl. .................... 438/26; 438/22; 257/E21.499; 257/E21.502
(58) Field of Classification Search .................... 438/26; 257/E21.499, E21.502; 313/504, 512
See application file for complete search history.

(56) References Cited

U.S. PATENT DOCUMENTS

| | | | |
|---|---|---|---|
| 2002/0030440 A1* | 3/2002 | Yamazaki | 313/503 |
| 2003/0012231 A1* | 1/2003 | Tayebati et al. | 372/20 |
| 2004/0061437 A1* | 4/2004 | Ikagawa | 313/506 |
| 2005/0248272 A1* | 11/2005 | Koike et al. | 313/512 |
| 2006/0284556 A1* | 12/2006 | Tremel et al. | 313/512 |
| 2007/0132381 A1 | 6/2007 | Hayashi et al. | |

FOREIGN PATENT DOCUMENTS

| | | |
|---|---|---|
| JP | 08-111286 A | 4/1996 |
| JP | 10-261487 A | 9/1998 |
| JP | 2000-223264 A | 8/2000 |
| JP | 2002-033186 A | 1/2002 |
| JP | 2002-134270 A | 5/2002 |

(Continued)

*Primary Examiner* — Charles Garber
*Assistant Examiner* — Abdulfattah Mustapha
(74) *Attorney, Agent, or Firm* — Sughrue Mion, PLLC

(57) ABSTRACT

The present invention is intended to provide a method for manufacturing an organic EL device, which method can form a film having high barrier properties to water vapor or oxygen, while suppressing damage to an organic EL element, during formation of the film including inorganic layers for sealing the organic EL element. When an organic EL element (20) which is composed of a pair of electrodes in which at least one of the electrodes being transparent or translucent and an organic EL layer (22) which comprises a light-emitting layer held between the electrodes, and a sealing layer (30) which includes at least one layer of inorganic film being in contact with the organic EL element (20) and which seals the organic EL element (20) are formed on a substrate (10), a first sealing film (31) which is included in the sealing layer (30) and which is in contact with the organic EL element (20) is formed by ion beam sputtering method, and the other inorganic film which is included in the sealing layer (30) is formed by any method other than the ion beam sputtering method.

4 Claims, 6 Drawing Sheets

FOREIGN PATENT DOCUMENTS

| | | |
|---|---|---|
| JP | 2004-247079 A | 9/2004 |
| JP | 2004-356095 A | 12/2004 |
| JP | 2005-126791 A | 5/2005 |
| JP | 2007157606 A | 6/2007 |
| JP | 2007-273274 A | 10/2007 |
| WO | 2007/037358 A1 | 4/2007 |

* cited by examiner

METHOD FOR MANUFACTURING ORGANIC ELECTROLUMINESCENCE DEVICE

TECHNICAL FIELD

The present invention relates to a method for manufacturing an organic electroluminescence device. The term "electroluminescence" may be hereinafter abbreviated as EL.

BACKGROUND ART

An organic EL element is composed of a pair of electrodes and an organic EL layer sandwiched therebetween, at least one of the electrodes being transparent or translucent, and the organic EL layer including a light-emitting layer made from an organic light-emitting material. When a voltage is applied between the one pair of the electrodes of the organic EL element having such a structure, electrons are injected from a cathode into the light emitting layer, and holes are injected from an anode into the light emitting later and then they recombine in the light emitting layer. The light-emitting material in the light-emitting layer is excited by the energy generated at the time, and emits light in the light-emitting layer. An organic EL device mentioned herein is composed of the organic EL element formed on a substrate. For example, an organic EL device composed of an organic EL element formed on a planar substrate may be used as, for example, a planar light source, a segment display unit, or a dot matrix display device.

An organic EL element is deteriorated by exposure to water vapor or oxygen. As a countermeasure, for example, an anode, an organic EL layer including a light-emitting layer, and a cathode are sequentially stacked in this order on a substrate such as a glass substrate thereby producing an organic EL element, and then the whole of the organic EL element is covered with an inorganic passivation film composed of silicon nitride, and a resin sealing film composed of resin and formed on the surface of the inorganic passivation film, thus preventing deterioration of the organic EL element by exposure to water vapor (for example, see Patent Document 1). Here, the inorganic passivation film is formed by a plasma CVD (chemical vapor deposition) method or sputtering method.

Patent Document 1: JP2000-223264 A

DISCLOSURE OF INVENTION

Problems to be Solved by the Invention

There are various sputtering methods to form conventional inorganic passivation films. In usual cases, magnetron sputtering method achieving a high film formation rate is used. As described above, the magnetron sputtering method can form an inorganic passivation film at a high film formation rate, but the film does not have high barrier properties to water vapor or oxygen. The CVD method, which has been used for the formation of conventional inorganic passivation films, can form an inorganic passivation film at a high film formation rate with less damage to the light-emitting layer in comparison with the magnetron sputtering method, but the film also does not have high barrier properties to water vapor or oxygen. Consequently, the inorganic passivation films formed by the magnetron sputtering method or CVD method have defects such as pinholes, through which external gases such as water vapor or oxygen penetrate into the organic EL element.

The present invention has been accomplished in view of the above-described problems, and is intended to provide a method for manufacturing an organic EL device, which method can form a film having high barrier properties to water vapor or oxygen with less damage to the organic EL element during formation of films such as inorganic layers for sealing the organic EL element.

Means for Solving Problem

In order to achieve the above object, the present invention provides a method for manufacturing an organic EL device having the following structure.

[1] A method for manufacturing an organic electroluminescence device composed of a supporting substrate and an organic electroluminescence element mounted thereon, the organic electroluminescence element being enclosed with the supporting substrate and a sealing layer including at least a first inorganic film and a second inorganic film configured to be cut off from the outside, the method comprising:

forming the first inorganic film by an ion beam sputtering method configured to cover an exposed surface of the organic electroluminescence element mounted on the supporting substrate; and forming the second inorganic film by a film formation method different from the ion beam sputtering method to cover the first inorganic film after the formation of the first inorganic film.

[2] The method for manufacturing an organic electroluminescence device according to the [1], wherein the film formation method different from the ion beam sputtering method is a CVD method or a magnetron sputtering method.

[3] A method for manufacturing an organic electroluminescence device composed of a supporting substrate and an organic electroluminescence element mounted thereon, the organic electroluminescence element being enclosed with the supporting substrate and a sealing layer including at least a first inorganic film and a second inorganic film configured to be cut off from the outside, the method comprising:

forming the first inorganic film by an ion beam sputtering method configured to cover the exposed surface of the organic electroluminescence element mounted on the supporting substrate; and forming the second inorganic film by a film formation method different from the ion beam sputtering method to further cover the first inorganic film after the formation of the first inorganic film, wherein the second inorganic film is made from the same material as the first inorganic film.

[4] The method for manufacturing an organic electroluminescence device according to the [3], wherein the film formation method different from the ion beam sputtering method is a CVD method or a magnetron sputtering method.

A sputtering method refers to a method of forming a thin film, in which fine particles of a target material (thin film material) are ejected into the gas phase by bombarding the target material with fine particles of an atom or molecular size, and deposited on the surface of a predetermined substrate to form a thin film. In a more limited sense, the term "sputtering" may refer to ejection of fine particles of a target material into the gas phase due to bombardment of the target material by fine particles of an atom or molecular size.

A ion beam sputtering method refers to a method of sputtering, in which fine particles of a target material are sputtered by irradiation to the target material with an ion beam.

A magnetron sputtering method is a method of sputtering, in which the target material is sputtered by magnetron discharge under application of a magnetic field to the neighborhood of the target material.

A CVD (Chemical Vapor Deposition) method refers to a method of forming a thin film, in which a raw material gas containing constituent elements of the thin film are fed into the reaction chamber to cause chemical reaction upon application of energy such as heat or plasma, and then the reaction product is deposited on a surface of a predetermined substrate to form a thin film.

Effect of the Invention

According to the present invention, a sealing layer having high barrier properties to gases such as water vapor or oxygen is formed on an organic EL element with less damage to the organic EL element during formation of the sealing layer. As a result, an organic EL device having a longer lifetime can be obtained.

BRIEF DESCRIPTION OF THE DRAWINGS

FIG. 2-1 is a partial cross sectional view schematically depicting an example of the method for manufacturing an organic EL device in accordance with the present invention (part 1).

FIG. 2-2 is a partial cross sectional view schematically depicting an example of the method for manufacturing an organic EL device in accordance with the present invention (part 2).

FIG. 2-3 is a partial cross sectional view schematically depicting an example of the method for manufacturing an organic EL device in accordance with the present invention (part 3).

FIG. 3 is a diagram schematically depicting the structure of an ion beam sputtering device.

FIG. 4-1 is a partial cross sectional view depicting an example of the structure of a sealing layer.

FIG. 4-2 is a partial cross sectional view depicting another example of the structure of a sealing layer.

FIG. 4-3 is a partial cross sectional view depicting yet another example of the structure of a sealing layer.

Figure 1:
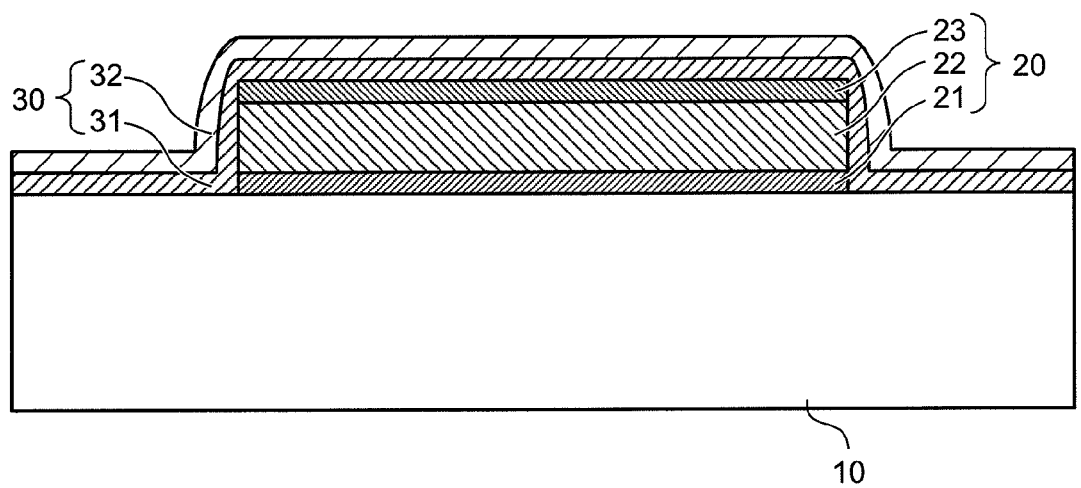
FIG. 1 is a partial cross sectional view schematically showing an example of the structure of an organic EL device in accordance with the present invention.

REFERENCE NUMERALS 10, 10A supporting substrate
20 organic EL element
21 anode
22 organic EL layer
23 cathode
30 sealing layer
31 to 35, 33A, 33B sealing film
36A, 36B, 36C inorganic film
37A, 37B organic film
38 uppermost organic film
100 ion beam sputtering device
101 vacuum chamber
102 substrate holder
103 target
104 ion source
105 vacuum pump
111 ion beam
112 sputtered particles

BEST MODE FOR CARRYING OUT THE INVENTION

Embodiments of the present invention will be further described below with reference to drawings. For easier understanding, the scale of the members in the drawings may be different from that of practical members. The present invention will not be limited to the following description, and may be modified without departing from the spirit and scope of the present invention. The organic EL device also includes members such as lead wires for the electrodes, but they are not depicted because they are not essential to explain the present invention. For convenience to explain the layered structure or the like, the substrates are positioned down in the drawings of the following examples. However, the organic EL element of the present invention and the organic EL device having the organic EL element mounted thereon are not necessary to be placed in line with the up-down or right-left orientation depicted in the drawings for producing or using, and the orientation may be appropriately adjusted.

FIG. 1 is a cross sectional view schematically depicted an example of the structure of an organic EL device according to the present invention. The organic EL device is a top emission type organic EL device in which light is emitted from the organic EL element 20 formed on the supporting substrate 10 at the side opposite to the supporting substrate 10. In the organic EL device shown in FIG. 1, the organic EL element 20 composed of an anode 21, an organic EL layer 22 including a light-emitting layer, and a cathode 23, which are stacked in this order, is formed on a supporting substrate 10, and a sealing layer 30 covers the whole of the organic EL element 20 formed on the supporting substrate 10.

Usable examples of the supporting substrate 10 may include various substrates such as glass, silicon, and plastic substrates. The anode 21 is usually a conductive metal oxide film or a translucent metal thin film with a relatively high work function (preferably greater than 4.0 eV). Specific usable examples may include indium tin oxides (hereinafter referred to as ITOs), metal oxides such as tin oxide, metals such as gold (Au), platinum (Pt), silver (Ag), and copper (Cu), or alloys containing at least one of these metals, and organic transparent conductive films such as polyaniline or derivatives thereof, and polythiophene or derivatives thereof. The anode 21 may be, as necessary, composed of two or more layers. The anode 21 may have any film thickness according to electric conductivity (and also optical permeability, when the device is of a bottom emission type). The thickness is, for example, from 10 nm to 10 µm, preferably from 20 nm to 1 µm, and more preferably from 50 nm to 500 nm. Examples of methods for forming the anode 21 may include a vacuum deposition method, a sputtering method, an ion plating method, a plating method. When the device is the top emission type, a reflection film for reflecting light emitted toward the substrate may be formed below the anode 21.

The organic EL layer 22 includes at least a light-emitting layer made from an organic substance. The light-emitting layer contains an organic substance (small compound or large compound) emitting fluorescence or phosphorescence, and may further contain a dopant material. Examples of the organic substance include dye materials, metal complex materials, and polymer-based materials. The dopant material may be doped to the organic substance as necessary, according to the purposes such as improvement of the organic luminous efficiency and shift of the emission wavelength of the organic substance. The thickness of the light-emitting layer made from the organic substance and the optionally doped dopant is usually from 20 angstroms to 2,000 angstroms.

(Dye Materials)

Examples of dye materials may include cyclopentamine derivatives, tetraphenyl butadiene derivative compounds, triphenylamine derivatives, oxadiazole derivatives, pyrazoloquinoline derivatives, distyryl benzene derivatives, distyryl arylene derivatives, pyrrole derivatives, thiophene cyclic compounds, pyridine cyclic compounds, perinone derivatives, perylene derivatives, oligothiophene derivatives, trifumanylamine derivatives, oxadiazole dimers, and pyrazoline dimers.

(Metal Complex Materials)

Examples of the metal complex materials may include metal complexes which emits light from the triplet excited state, such as iridium complexes and platinum complexes; and metal complexes, such as alumiquinolinol complexes, benzoquinolinol beryllium complexes, benzoxazolyl zinc complexes, benzothiazole-zinc complexes, azomethyl zinc complexes, porphyrin-zinc complexes, and europium complexes, which include aluminum (Al), zinc (Zn), beryllium (Be) or the like, or a rare earth metal such as terbium (Tb), europium (Eu), and dysprosium as a central metal, and include oxadiazole, thiadiazole, phenylpyridine, phenylbenzoimidazole, or quinoline as a ligand.

(Polymer Materials)

Examples of the polymer materials may include polyparaphenylene vinylene derivatives, polythiophene derivatives, polyparaphenylene derivatives, polysilane derivatives, polyacetylene derivatives, polyfluorene derivatives, polyvinylcarbazole derivatives, and polymers of the above described dyes and metal complex light-emitting materials.

Among the light-emitting materials, examples of those emitting blue light may include distyryl arylene derivatives, oxadiazole derivatives and polymers thereof, polyvinylcarbazole derivatives, polyparaphenylene derivatives, polyfluorene derivatives, quinacridone derivatives, and coumarin derivatives. Among them, polymer materials such as polyvinylcarbazole derivatives, polyparaphenylene derivatives and polyfluorene derivatives are preferred.

Examples of materials emitting green light may include quinacridone derivatives and coumarin derivatives and polymers thereof, polyparaphenylene vinylene derivatives, and polyfluorene derivatives. Among them, polymer materials such as polyparaphenylene vinylene derivatives and polyfluorene derivatives are preferred.

Examples of materials emitting red light may include coumarin derivatives and thiophene cyclic compounds and polymers thereof, polyparaphenylene vinylene derivatives, polythiophene derivatives, and polyfluorene derivatives. Among them, polymer materials such as polyparaphenylene vinylene derivatives, polythiophene derivatives, and polyfluorene derivatives are preferred.

(Dopant Material)

Examples of dopant materials may include perylene derivatives, coumarin derivatives, rubrene derivatives, quinacridone derivatives, squarylium derivatives, porphyrin derivatives, styryl-based dyes, tetracene derivatives, pyrazolone derivatives, decacyclene, and phenoxazone.

The organic EL layer 22 may further include, in addition to the light-emitting layer, other layers between the light-emitting layer and the anode 21, and between the light-emitting layer and the cathode 23. Examples of the layers provided between the light-emitting layer and the anode 21 include a hole injection layer for improving the efficiency of hole injection from the anode 21, and a hole transport layer for improving hole injection from the anode 21, the hole injection layer, or another hole transport layer closer to the anode 21 into the light-emitting layer. Examples of the layers provided between the light-emitting layer and the cathode 23 include an electron injection layer for improving the efficiency of electron injection from the cathode 23, and an electron transport layer for improving electron injection from the cathode 23, electron injection layer, or another electron transport layer closer to the cathode 23.

(Hole Injection Layer)

Examples of materials constituting the hole injection layer may include phenylamines, starburst amines, phthalocyanines, oxides such as vanadium oxides, molybdenum oxides, ruthenium oxides, and aluminum oxides, amorphous carbon, polyaniline, and polythiophene derivatives.

(Hole Transport Layer)

Examples of the material composing the hole transport layer include polyvinylcarbazole or derivatives thereof, polysilane or derivatives thereof, polysiloxane derivatives having aromatic amine in the side or main chain, pyrazoline derivatives, arylamine derivatives, stilbene derivatives, triphenyldiamine derivatives, polyaniline or derivatives thereof, polythiophene or derivatives thereof, polyarylamine or derivatives thereof, polypyrrole or derivatives thereof, poly (p-phenylene vinylene) or derivatives thereof, and poly(2,5-thienylene vinylene) or derivatives thereof.

When the hole injection layer or hole transport layer has an ability of blocking the electron transportation, the hole transport layer or hole injection layer may be referred to as an electron block layer.

(Electron Transport Layer)

The electron transport layer may be composed of a known material. Examples of materials may include oxadiazole derivatives, anthraquinodimethane or derivatives thereof, benzoquinone or derivatives thereof, naphthoquinone or derivatives thereof, anthraquinone or derivatives thereof, tetracyanoanthraquinodimethane or derivatives thereof, fluorenone derivatives, diphenyl dicyanoethylene or derivatives thereof, diphenoquinone derivatives, or metal complexes of 8-hydroxyquinoline or derivatives thereof, polyquinoline or derivatives thereof, polyquinoxaline or derivatives thereof, and polyfluorene or derivatives thereof.

(Electron Injection Layer)

The electron injection layer may be composed of, according to the type of the light-emitting layer, a single layer of Ca layer, or a stacked structure including a Ca layer and another layer composed of one or more materials selected from the group consisting of Group IA and IIA metals in the periodic table excluding Ca which have a work function of 1.5 to 3.0 eV, and oxides, halides and carbonates thereof. Examples of the Group IA metal in the periodic table which has a work function of 1.5 to 3.0 eV, and oxides, halides and carbonates thereof may include lithium, lithium fluoride, sodium oxide, lithium oxide, and lithium carbonate. Examples of the Group IIA metal in the periodic series excluding Ca which has a work function of 1.5 to 3.0 eV, and oxides, halides and carbonates thereof may include strontium, magnesium oxide, magnesium fluoride, strontium fluoride, barium fluoride, strontium oxide, and magnesium carbonate.

When the electron transport layer or electron injection layer has an ability of blocking the hole transportation, the electron transport layer or electron injection layer may be referred to as a hole block layer.

The cathode 23 is preferably a transparent or translucent material which has a relatively low work function (preferably lower than 4.0 eV), and readily injects electrons into the light-emitting layer. Usable examples may include metals such as lithium (Li), sodium (Na), potassium (K), rubidium (Rb), cesium (Cs), Be, magnesium (Mg), calcium (Ca), strontium (Sr), barium (Ba), Al, scandium (Sc), vanadium (V), Zn, yttrium (Y), indium (In), cerium (Ce), samarium (Sm), Eu, Tb, and ytterbium (Yb); alloys composed of two or more of these metals; alloys composed of one or more of these metals and one or more metals selected from Au, Ag, Pt, Cu, manganese (Mn), titanium (Ti), cobalt (Co), nickel (Ni), tungsten (W), and tin (Sn); graphite or graphite intercalation compounds; and metal oxides such as ITO and tin oxide.

The cathode 23 may have a stacked structure composed of two or more layers. The stacked structure may be composed of metals such as Al, Ag, or chromium (Cr) and any of the above described metals, metal oxides, fluorides or alloys thereof. The cathode 23 may have any film thickness according to electric conductivity and durability. The thickness is, for example, from 10 nm to 10 µm, preferably from 20 nm to 1 µm, and more preferably from 50 nm to 500 nm. Examples of methods for forming the cathode 23 may include a vacuum deposition method, a sputtering method, and a lamination method in which a metal thin film is bonded by thermocompression.

The layers provided between the light-emitting layer and anode 21, and between the light-emitting layer and cathode 23 may be selected according to the performance required of the organic EL device to be made. For example, the organic EL element 20 in the present invention may have any of the following layer structures (a) to (o):
(a) anode/hole transport layer/light-emitting layer/cathode
(b) anode/light-emitting layer/electron transport layer/cathode
(c) anode/hole transport layer/light-emitting layer/electron transport layer/cathode
(d) anode/hole injection layer/light-emitting layer/cathode
(e) anode/light-emitting layer/electron injection layer/cathode
(f) anode/hole injection layer/light-emitting layer/electron injection layer/cathode
(g) anode/hole injection layer/hole transport layer/light-emitting layer/cathode
(h) anode/hole transport layer/light-emitting layer/electron injection layer/cathode
(i) anode/hole injection layer/hole transport layer/light-emitting layer/electron injection layer/cathode
(j) anode/hole injection layer/light-emitting layer/electron transport layer/cathode
(k) anode/light-emitting layer/electron transport layer/electron injection layer/cathode
(l) anode/hole injection layer/light-emitting layer/electron transport layer/electron injection layer/cathode
(m) anode/hole injection layer/hole transport layer/light-emitting layer/electron transport layer/cathode
(n) anode/hole transport layer/light-emitting layer/electron transport layer/electron injection layer/cathode
(o) anode/hole injection layer/hole transport layer/light-emitting layer/electron transport layer/electron injection layer/cathode
(Symbol "/" indicates that the layers are adjacent to each other and stacked. The same applies below.)

In the layered structures (a) to (o), either embodiment in which the anode is provided at the side closer to the substrate or embodiment in which cathode is provided at the side closer to the substrate may be employed.

The sealing layer 30 is a layer having the high barrier property against gases such as water vapor and oxygen for the purpose of preventing the gases from being in contact with the organic EL element, and is provided for sealing the organic EL element. The sealing layer 30 includes first and second inorganic films, in which at least the first inorganic film is in contact with the organic EL element 20. The term "barrier property" herein refers to the impermeability of the organic EL element 20 to gases such as water vapor and oxygen existing in the environment surrounding the organic EL device. Specifically, the barrier property of a layer depends on film defects such as pinholes of the film. The higher the density and continuity a film has, the higher the barrier property it gets. Examples of the sealing layer 30 may include single films such as SiN, SiO, SiON and Al2O3 films, and stacked films thereof, and stacked films composed of these films and organic films such as acrylic monomers. In the present embodiment, the sealing layer 30 is composed of, from the supporting substrate 10 side, the first sealing film 31 (first inorganic film) having high barrier properties, and the second sealing film 32 (second inorganic film) having lower barrier properties than the first sealing film 31.

In the present embodiment, the first sealing film 31 having high barrier properties is formed on the supporting substrate 10 side, and the second sealing film 32, which is made from the same material as the first sealing film 31 and has lower barrier properties than the first sealing film 31, is formed on the first sealing film 31, thereby protecting the organic EL element 20 from the outside air to be capable of blocking the organic EL element 20 from water vapor and oxygen. It will be sufficient that the first sealing film 31 having high barrier properties to gas constitutes a small portion of the sealing layer 30 on the organic EL element 20 side. The thickness of the first sealing film 31 is preferably from 50 to 100 nm from the viewpoint of manufacture cost.

Figures 1, 2:
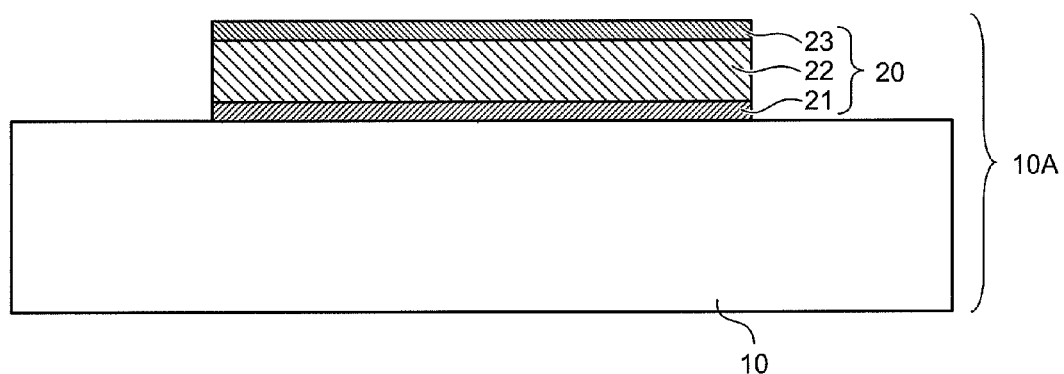
Figure 2:
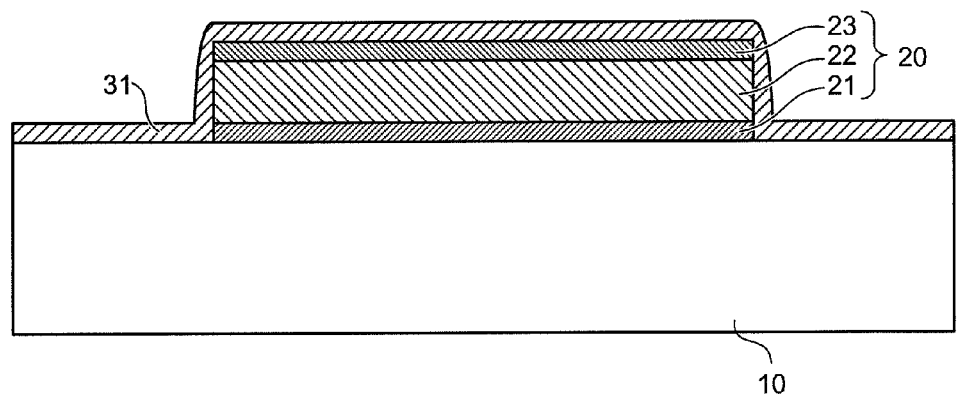
Figures 2, 3:
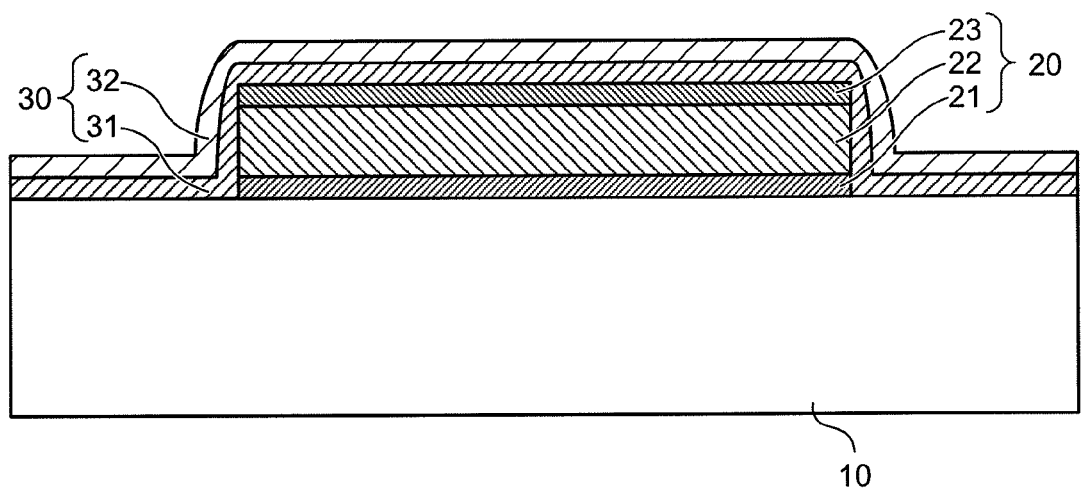
Figure 3:
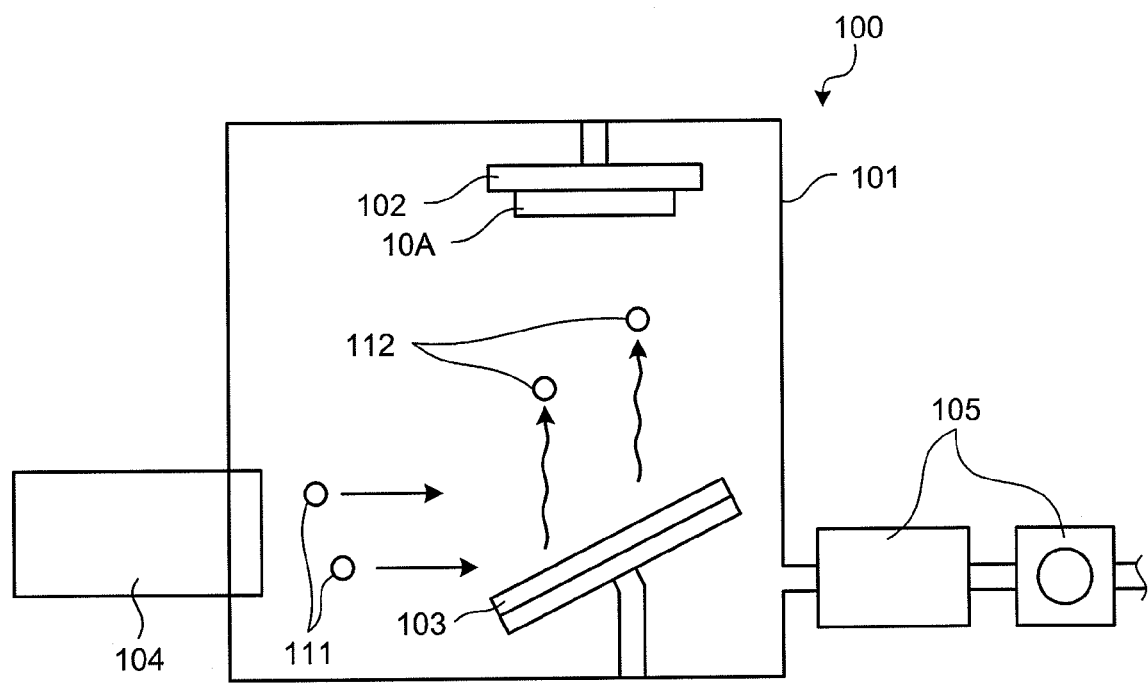

The method for manufacturing an organic EL device having the above structure is described below. FIGS. 2-1 to 2-3 schematically show examples of the method for manufacturing an organic EL device according to the present invention. First, the anode 21, the organic EL layer 22 including a light-emitting layer, and the cathode 23, each of which has a predetermined patterned shape, are sequentially formed in this order by a known method on the supporting substrate 10 such as a glass substrate, thus producing the organic EL element 20 (FIG. 2-1). For example, when the organic EL device is used as a dot matrix display device, banks (not depicted) for dividing the light-emitting region into matrices are formed, and the organic EL layer 22 containing a light-emitting layer is formed in the regions surrounded by the banks.

Then, the first sealing film 31 having an predetermined thickness is formed by the ion beam sputtering method on the supporting substrate 10 having the organic EL element 20 (FIG. 2-2). The thickness of the first sealing film 31 is preferably at least 50 nm or more. This is because if the thickness of the first sealing film 31 is smaller than 50 nm, it likely has defects such as pinholes. The thickness of the first sealing film 31 may be greater than 50 nm, but formation of such a thick film by the ion beam sputtering method takes a long time. Therefore, the thickness of the first sealing film 31 is appropriately selected according to the time to be spent for manufacturing the organic EL device.

FIG. 3 schematically shows the structure of an ion beam sputtering device. As shown in FIG. 3, the ion beam sputtering device 100 comprises a vacuum chamber 101 containing a substrate holder 102, a target 103, and an ion source 104, the substrate holder 102 holding a supporting substrate 10 (a supporting substrate 10A having the organic EL element 20), the target 103 being composed of the material to form the first sealing film 31 or a portion of the material, and the ion source 104 feeding a plasma ion beam 111 to the target 103. The vacuum chamber 101 has been evacuated by a vacuum pump 105 so as to give an predetermined degree of vacuum during film formation. For example, when the first sealing film 31 is composed of an SiO film, the target 103 is SiO or Si. When an Si target is used, oxygen or other gas is fed from a gas feeding unit (not depicted) into the vacuum chamber 101 so as to deposit an SiO film on the surface of the supporting substrate 10A held by the substrate holder 102. Such gas feeding also occurs during formation of the first sealing film 31 composed of other material.

In the ion beam sputtering device 100, the supporting substrate 10A is held by the substrate holder 102, the vacuum pump 105 evacuates the vacuum chamber 101 to an predetermined degree of vacuum, and then the ion beam 111 such as argon ion is emitted from the ion source 104 toward the target 103, and bumpes against the target 103 under acceleration with predetermined energy. As a result of this, the particles composing the target are sputtered, and a portion of the sputtered particles 112 reaches the surface of the supporting substrate 10A, and is deposited thereon to form a thin film (the first sealing film 31).

The ion beam 111 (incidence ions) emitted from the ion source 104 bumps against the target 103, and then enters into the target 103 or is reflected off the target 103. A portion of the ion beam 111 (incidence ions) reflected off the target 103 is directed toward the supporting substrate 10A; however, owing to the structure of the ion beam sputtering device 100, the proportion of the high energy ion beam reflected off the target 103 toward the supporting substrate 10A is very small to the whole. Therefore, the light-emitting layer of the organic EL element 20 is less affected in comparison with the case under the magnetron sputtering method. In addition, argon or other gas is ionized by the ion source 104 to generate the ion beam 111, so that no plasma enters into the vacuum chamber 101 in which a thin film is formed. Accordingly, it is possible to reduce the effect by the plasma to the light-emitting layer on the supporting substrate 10A.

There is a disadvantage that the film formation rate by the ion beam sputtering method is lower than that of magnetron sputtering method or CVD method, but the film formed by the ion beam sputtering method is superior in density and barrier properties. Therefore, a film having a certain thickness formed by the ion beam sputtering method has about three to ten times higher barrier properties than other film having the same thickness formed by the CVD method or the magnetron sputtering method. In other words, a film having a certain thickness formed by the ion beam sputtering method has the equal barrier properties to a film having three to ten times thickness formed by the CVD method or the magnetron sputtering method.

Subsequently, the second sealing film 32 having an predetermined thickness is formed on the first sealing film 31 by any film formation method other than ion beam sputtering method, such as the CVD method or the magnetron sputtering method (FIG. 2-3). The formation of the second sealing film 32 uses a method achieving a higher film formation rate than the ion beam sputtering method. Through the above procedure, an organic EL device is produced.

As described above, the first sealing film 31 of the sealing layer 30 is formed on the organic EL element 20 side by the ion beam sputtering method to give an predetermined thickness, and the second sealing film 32 is formed on the first sealing film 31 by the CVD method or the magnetron sputtering method; as a result, the organic EL element 20 has higher barrier properties for outside air than other organic EL device having a conventional sealing layer. In addition, the first sealing film 31 is thinner and has higher barrier properties than the second sealing film 32, so that the total thickness of the sealing layer 30 can be smaller than that of a thin film in which all sealing layers have been formed by the CVD method or the magnetron sputtering method.

Figures 1, 4:
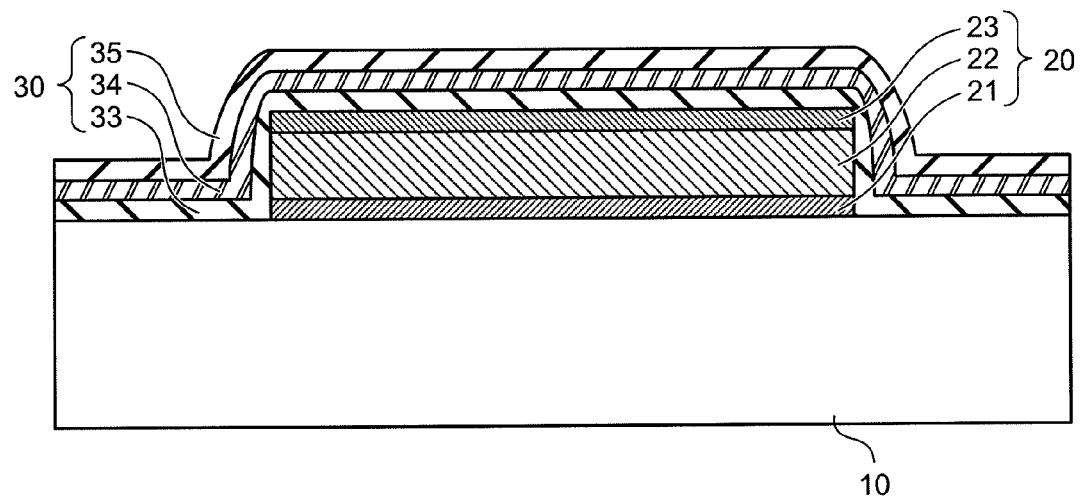
Figures 2, 4:
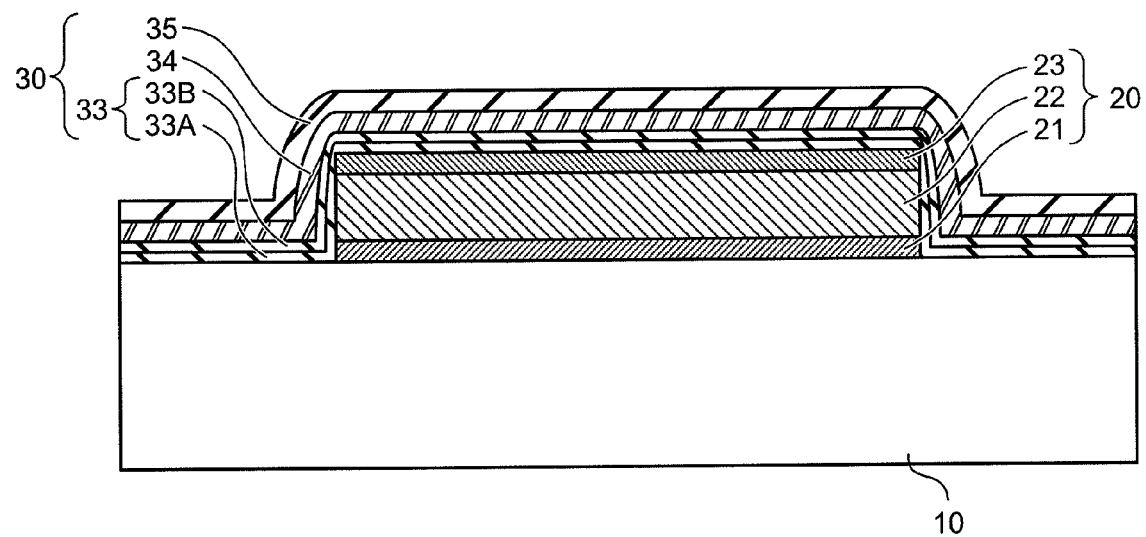
Figures 3, 4:
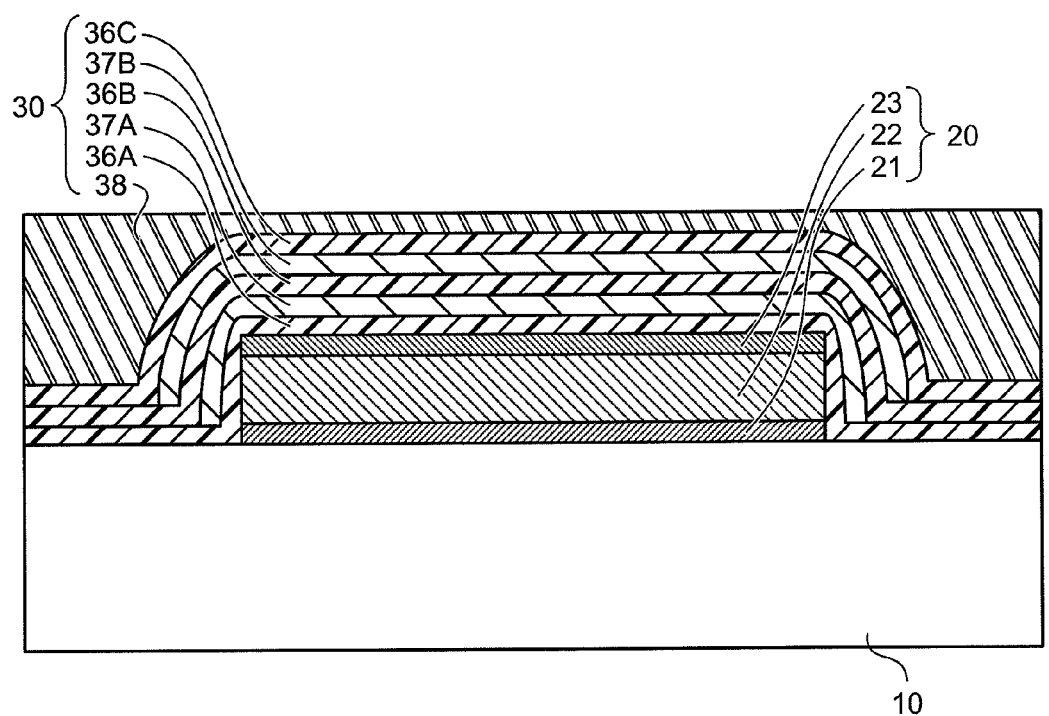

In the above embodiment, the sealing layer 30 composed of a single material is formed by different methods. The present invention is not limited to this embodiment, so that the formation of the sealing layer 30 may use other method. FIGS. 4-1 to 4-3 show examples of the structure of sealing layers. In these figures, same elements with those in the above figures are indicated by same reference numerals, and explanations thereof are not repeated.

FIG. 4-1 depicts a sealing layer composed of three layers of inorganic film. The sealing layer 30 has a stacked structure composed of, from the supporting substrate 10 (organic EL element 20) side, the SiN film 33, the SiO or SiON film 34, and an SiN film 35. Among them, the lowermost SiN film 33 is formed by the ion beam sputtering method, and the SiO or SiON film 34 and the SiN film 35 formed thereon are formed by a method such as CVD method or magnetron sputtering method.

FIG. 4-2 depicts a sealing layer composed of three layers of inorganic film in the same manner as in FIG. 4-1. In the sealing layer 30, the lowermost SiN film 33 shown in FIG. 4-1 is composed of the first SiN film 33A formed by the ion beam sputtering method and the second SiN film 33B formed by the CVD method or the magnetron sputtering method on the first SiN film 33A. The same elements with those in FIG. 4-1 are indicated by same reference numerals, and explanations thereof are not repeated.

In FIG. 4-2, the SiO or SiON film 34 and the SiN film 35 formed thereon may have a stacked structure composed of the first film formed by ion beam sputtering method and the second film formed by CVD method or magnetron sputtering method on the first film.

FIG. 4-3 depicts a sealing layer having a stacked structure composed of inorganic films and organic films. The sealing layer 30 comprises inorganic films 36A, 36B, and 36C and organic films 37A and 37B, which are formed in this order from the supporting substrate 10 (organic EL element 20) side, and the uppermost organic film 38 formed on the top inorganic film 36C. The organic films 37A, 37B, and the uppermost organic film 38 correct defects such as pinholes formed in the inorganic films 36A, 36B, and 36C, thereby improving the barrier properties. The regions of the organic films 37A and 37B should be smaller than those of the inorganic films 36A, 36B, and 36C. This is because if the edges of the organic films 37A and 37B are aligned with those of the inorganic films 36A, 36B, and 36C, the edges of the organic films 37A and 37B are exposed to outside air, and the organic films 37A and 37B deteriorate therefrom.

In order to produce the sealing layer 30 having the above structure, the lowermost inorganic film 36A is formed by the above described ion beam sputtering method, the organic films 37A and 37B, and the uppermost organic film 38 are formed by a flash deposition method or the like, and the inorganic films 36B and 36C are formed by the CVD method or magnetron sputtering method.

Staking the inorganic films 36A, 36B and 36C, and the organic films 37A and 37B results in an embodiment that there is the inorganic film 36A with high barrier properties as the lowest layer and the organic films 37A, 37B and the uppermost organic film 38 are provided to correct defects in the inorganic films 36A, 36B, and 36C, thereby generating synergetic effect; as a result, the sealing layer 30 with high barrier properties are formed. If the film is formed by a conventional CVD method or magnetron sputtering method, for example, five layers of inorganic film are necessary. On the other hand, owing to the lowermost inorganic film 36A formed by ion beam sputtering method, the sealing layer 30 can achieves as high barrier properties as conventional sealing layer composed of five layers of inorganic film, even though the sealing layer 30 is composed of a fewer number of inorganic film (for example, three layers of inorganic film).

In the structure shown in FIG. 4-3, the inorganic films 36A, 36B, and 36C may be formed by forming the first film having an predetermined thickness by the ion beam sputtering method, and then forming the second film on the first film by the CVD method or magnetron sputtering method.

In the above embodiment, the top emission type organic EL device is explained. The present invention is also applicable to a bottom emission type organic EL device in which light produced by the organic EL layer 22 is extracted from the supporting substrate 10 side.

The organic EL element of the present invention is useful for a planar light source, a segment display device, or a dot-matrix display device.

According to the embodiment, the sealing layer 30, which blocks the organic EL element 20 formed on the supporting substrate 10 from ambient air, is composed of a film formed by the ion beam sputtering method so as to directly cover the organic EL element 20, and another film formed thereon by CVD method or magnetron sputtering method; as a result, the sealing layer 30 can enhances barrier properties of the organic EL element 20 in the organic EL device to ambient air. In addition, a portion of the sealing layer 30 is formed by the ion beam sputtering method, and the other portion is formed by the CVD method, the magnetron sputtering method or the like which achieves a high film formation rate, thus achieving higher production effectiveness than the case in which the sealing layer 30 is entirely formed by the ion beam sputtering method.

EXAMPLE

The present invention is further described below with reference to the following example and comparative example, but the present invention will not be limited thereto.

Example

In the present example, an organic EL device having the structure shown in FIG. 1 is produced. First, an ITO film is formed on a glass substrate as a substrate (10) by the sputtering method to give a thickness of about 150 nm, and patterned into a predetermined shape by photolithography and etching techniques, thus forming an anode 21. Subsequently, the glass substrate (10) having the anode (21) is washed with an organic solvent, an alkali detergent, and ultrapure water, dried, and then subjected to ultraviolet/ozone cleaning treatment using an ultraviolet/ozone cleaning device.

Thereafter, a suspension of poly(3,4)ethylenedioxythiophene/polystyrene sulfonic acid (Baytron (registered trademark) P TP AI 4083 (trade name), manufactured by HC Starck-V TECH) is filtered through a 0.5 μm filter, and the filtered suspension is deposited on the glass substrate (10) having the anode 21 by the spin coating method to form a film having a thickness of 70 nm. Thereafter, the glass substrate (10) is placed on a hot plate, and dried in an atmosphere at 200° C. for 10 minutes, thus forming a hole injection layer.

Thereafter, a 1.5% by weight solution of a polymer organic light-emitting material (Lumation GP1300 (trade name), manufactured by Sumation) is prepared with a mixed solvent containing xylene and anisole at 1:1. The solution is deposited on the glass substrate (10) having the hole injection layer by the spin coating method to form a film having a thickness of 80 nm, thus forming a light-emitting layer. Subsequently, the light-emitting layer in the portion of the extraction electrode and sealing areas is removed from the glass substrate (10). The glass substrate (10) is introduced into a vacuum chamber, and moved into a heating chamber. The subsequent operations are carried out in vacuo or in a nitrogen atmosphere, thus preventing the organic EL device under treatment from being exposed to air.

After the glass substrate (10) is transferred into a heating chamber, the heating chamber in the vacuum chamber is evacuated to a degree of vacuum of $1 \times 10^{-4}$ Pa or less, where the glass substrate (10) is heated at about 100° C. for 60 minutes. Then, the glass substrate (10) is transferred into a deposition chamber, a cathode mask is aligned with the glass substrate (10), and deposition is carried out such that a cathode 23 is formed in the light-emitting region, where light emission occurs in the organic EL device, and the extraction electrode region. The cathode 23 is composed of a Ba film formed by the resistance heating method in which metal Ba is heated and deposited at a deposition rate of about 2 angstroms/sec to give a film thickness of 50 angstroms, and an Al film deposited by the electron beam deposition method at a deposition rate of about 2 angstroms/sec to give a film thickness of 100 angstroms. Thereafter, the glass substrate (10) is transferred into a vacuum chamber having a facing target sputtering device. Argon and oxygen gases are introduced into the vacuum chamber, and an ITO film having a thickness of 1,500 angstroms is formed by the facing target sputtering method. Through the above procedure, the organic EL element 20 is formed on the glass substrate (10).

Thereafter, the glass substrate (10) having the organic EL element (20) is transferred from the vacuum chamber having the facing target sputtering device to a vacuum chamber having an ion beam sputtering device without exposure to air. Then, argon and nitrogen gases are introduced into the vacuum chamber having the ion beam sputtering device, and a silicon nitride (SiN) film is deposited on the glass substrate (10) having the organic EL element 20 by ion beam sputtering method to form a first sealing film having a thickness of 500 angstroms.

Thereafter, the glass substrate (10) is transferred from the vacuum chamber having the ion beam sputtering device to a vacuum chamber having a plasma CVD device. Then, silane and nitrogen gases are introduced into the vacuum chamber having the plasma CVD device, and an SiN film is formed by plasma CVD method to produce a second sealing film 32 having a thickness of about 2 μm. Through the above procedure, an organic EL device is produced.

Comparative Example

For comparison with the organic EL device produced in the above described example, another organic EL device as a comparative example is produced as described below. The same procedure as the above described example is carried out until an ITO film having a thickness of 1,500 angstroms is formed by facing target sputtering method on the organic EL element (20) provided on the glass substrate (10).

Thereafter, the glass substrate (10) having the organic EL element (20) is transferred from the vacuum chamber having the facing target sputtering device to the vacuum chamber having the plasma CVD device without exposure to air. Then, silane and nitrogen gases are introduced into the vacuum chamber having the plasma CVD device, and an SiN film having a thickness of 2 μm is formed by the plasma CVD method.

The organic EL devices produced in the above-described example and comparative example are measured for their light emission life as follows: the organic EL element (20) is driven at a constant current of 10 mA, light emission is initiated with an initial brightness of about 2,000 cd/m², and the light emission life is measured while keeping the luminescence. As a result, the organic EL device of example having the sealing layer (30) including a dense SiN film achieves lower moisture permeability, and thus has a longer lifetime than the organic EL device of comparative example having a sealing layer formed exclusively by plasma CVD method.

INDUSTRIAL APPLICABILITY

As described above, the method for manufacturing an organic EL device according to the present invention is useful in blocking an organic EL element from water vapor and other gases.

The invention claimed is:

1. A method for manufacturing an organic electroluminescence device composed of a supporting substrate and an organic electroluminescence element mounted thereon, the organic electroluminescence element being cut off from the outside by being enclosed between the supporting substrate and a sealing layer including at least a first inorganic film and a second inorganic film, the method comprising:
   forming the first inorganic film by an ion beam sputtering method to cover an exposed surface of the organic electroluminescence element mounted on the supporting substrate; and
   forming the second inorganic film by a film formation method which is different from the ion beam sputtering method used to form the first inorganic film, and which shows higher film formation rate than the ion beam sputtering method to cover the first inorganic film after the formation of the first inorganic film,
   wherein the first inorganic film has higher barrier properties than the second inorganic film.

2. The method for manufacturing an organic electroluminescence device according to claim 1, wherein the film formation method is a CVD method or a magnetron sputtering method.

3. A method for manufacturing an organic electroluminescence device composed of a supporting substrate and an organic electroluminescence element mounted thereon, the organic electroluminescence element being cut off from the outside by being enclosed between the supporting substrate and a sealing layer including at least a first inorganic film and a second inorganic film, the method comprising:
   forming the first inorganic film by an ion beam sputtering method to cover the exposed surface of the organic electroluminescence element mounted on the supporting substrate; and
   forming the second inorganic film by a film formation method which is different from the ion beam sputtering method used to form the first inorganic film, and which shows higher film formation rate than the ion beam sputtering method to further cover the first inorganic film after the formation of the first inorganic film, wherein the second inorganic film is made from the same material as the first inorganic film,
   wherein the first inorganic film has higher barrier properties than the second inorganic film.

4. The method for manufacturing an organic electroluminescence device according to claim 3, wherein the film formation method is a CVD method or a magnetron sputtering method.

* * * * *